United States Patent [19]
Haoui et al.

[11] Patent Number: 5,742,640
[45] Date of Patent: Apr. 21, 1998

[54] METHOD AND APPARATUS TO IMPROVE PSTN ACCESS TO WIRELESS SUBSCRIBERS USING A LOW BIT RATE SYSTEM

[75] Inventors: Amine Haoui; Ayman Fawaz, both of Berkeley; Robert Kavaler, Kensington, all of Calif.

[73] Assignee: Diva Communications, Inc., Oakland, Calif.

[21] Appl. No.: 400,169

[22] Filed: Mar. 7, 1995

[51] Int. Cl.⁶ .................................................. H04Q 7/30
[52] U.S. Cl. .................. 375/220; 375/285; 375/296; 375/341; 375/346; 375/377; 371/37.4; 370/347; 455/422; 455/517; 455/560; 455/561
[58] Field of Search ............................ 371/30, 35, 37.1, 371/43; 375/214, 219, 220, 222, 285, 296, 316, 340, 341, 377; 379/58, 59, 93, 94, 97; 455/50.1, 52.1, 53.1, 54.1, 56.1, 63, 403, 422, 426, 466, 507, 517, 550, 560, 561; 370/95.3, 112, 119, 310, 321, 337, 347

[56] References Cited

U.S. PATENT DOCUMENTS

| | | | |
|---|---|---|---|
| 4,144,409 | 3/1979 | Utano et al. | 179/2 EB |
| 4,339,724 | 7/1982 | Feher | 328/164 |
| 4,644,565 | 2/1987 | Seo et al. | 375/60 |
| 4,654,867 | 3/1987 | Labedz et al. | 379/59 |
| 4,720,839 | 1/1988 | Feher et al. | 375/18 |
| 4,817,157 | 3/1989 | Gerson | 381/40 |
| 4,896,361 | 1/1990 | Gerson | 381/40 |
| 5,003,619 | 3/1991 | Morris et al. | 455/69 |
| 5,170,413 | 12/1992 | Hess et al. | 375/38 |
| 5,303,226 | 4/1994 | Okanoue et al. | 370/17 |
| 5,303,234 | 4/1994 | Kou | 370/85.2 |
| 5,305,468 | 4/1994 | Bruckert et al. | 455/69 |
| 5,313,494 | 5/1994 | Park et al. | 375/59 |
| 5,526,399 | 6/1996 | Kameda | 379/58 |

FOREIGN PATENT DOCUMENTS

| | | |
|---|---|---|
| 0 564 697 A1 | 10/1993 | European Pat. Off. . |
| 0 634 840 A1 | 1/1995 | European Pat. Off. . |
| 0 663 785 A2 | 7/1995 | European Pat. Off. . |
| 0 663 785 A2 | 10/1995 | European Pat. Off. . |
| 2 275 393 | 8/1994 | United Kingdom . |
| PCT/US90/06320 | 10/1990 | WIPO . |
| PCT/F193/00322 | 8/1993 | WIPO . |
| PCT/F193/00323 | 8/1993 | WIPO . |
| PCT/US94/07198 | 6/1994 | WIPO . |

OTHER PUBLICATIONS

Frazer E.L. et al., "CDLC-A Data Transmisson Standard For Cellular Radio," *The Journal of the Institution of Electronic and Radio Engineers*, vol. 57, No. 3, May/Jun. 1987, pp. 129–134.

(List continued on next page.)

*Primary Examiner*—Stephen Chin
*Assistant Examiner*—Amanda T. Le
*Attorney, Agent, or Firm*—Stephen C. Durant; Morrison & Foerster, LLP

[57] ABSTRACT

A method of cellular communication among a subscriber unit, a base station and a switch controller is provided which comprises the steps of digitally encoding speech signals at the subscriber unit; generating radio forward error correction (FEC) at the subscriber unit to protect the encoded speech signals during transmission; transmitting the encoded speech signals together with the radio FEC by radio from the subscriber unit to the base station; error correcting the transmitted encoded speech signals at the base station using the radio FEC; generating wire FEC to protect the encoded speech signals during transmission; transmitting the encoded speech signals together with the wire FEC from the base station to the controller; error correcting the transmitted encoded speech signals at the controller using the wire FEC; and decoding the digitally encoded speech signals at the controller.

26 Claims, 11 Drawing Sheets

OTHER PUBLICATIONS

Murch, A. et al., "Cellular Data Services Over GSM," *Microwave Journal,* vol. 38, No. 7, Jul. 1, 1995, pp. 90, 92, 94, 96.

Research & Development Center for Radio Systems (RCR), "Personal Digital Cellular Telecommunication System RCR Standard" RCR STD 27B (exerpts).

Research & Development Center for Radio Systems (RCR), "Personal Digital Cellular Telecommunication System RCR Standard" Part II, RCR STD 27B (excerpts).

METHOD AND APPARATUS TO IMPROVE PSTN ACCESS TO WIRELESS SUBSCRIBERS USING A LOW BIT RATE SYSTEM

BACKGROUND OF THE INVENTION

1. Field of the Invention

The invention relates generally to telephone transmission, and more particularly to the use of a low bit rate connection to couple wireless telephone subscriber units to a public switched telephone network (PSTN).

2. Description of the Related Art

There is an ever increasing demand for access to public switched telephone networks (PSTN). This increased demand has lead to the development of improved transmission systems capable of handling increasing volumes of telephone traffic. This has stimulated advances in the use of different media to transmit telephone signals.

There are several forms of telephone transmission media: guided, unguided, and semi-guided. Guided media constrain signals within established boundaries of physical construction. Metallic wire cable, fiber optic cable and coaxial cable are examples of guided media. Unguided media propagate signals in free space. Satellite communications and wireless telephones use unguided media. Semi-guided media, such as microwave links, achieve point-to-point communications without using physical constraints. There are different challenges associated with telephone transmission in guided, unguided and semi-guided media. The following background sections address some of the issues in telecommunications using guided and unguided media.

Guided Telecommunications

Them are two broad categories of guided transmission systems: voice frequency (VF) transmission systems and carrier transmission systems. VF transmission supports the ubiquitous local loops that connect business and residential customers with serving central offices. VF transmission also is used for short interoffice connections. The medium most often used for VF transmission is copper twisted pair, multipair cable. Carrier systems typically transmit multiple communication channels over longer distances. A connection between a PSTN, also referred to as a central office, and a local telephone in a home or office is commonly referred to as a local loop.

The most common medium supporting voice applications within homes and businesses (i.e., within the local loop) has been copper unshielded twisted pair (UTP). Essentially, a UTP includes plastic-insulated copper wires twisted together into a pair. A shielded twisted pair (STP) is similar to a UTP, but the twisted pair is surrounded by an additional metallic sheath before being clad in an insulating jacket. The twists or lays are varied in length to reduce the potential for signal interference between pairs. A drawback of twisted pairs is that, because copper has only finite conductivity, dispersion of the various frequency components that make up a complex signal can limit the upper bit rate that the medium can support. Transitions between logical 1 and logical 0 cannot be reliably detected where the signal waveform has been distorted due to dispersion. Consequently, conventional twisted pair communications lines can be limited to relatively low bit rates which can limit the volume of information that can be handled.

One conventional technique for increasing the data ram on a communication line is to concentrate signal channels using a multiplexing system commonly referred to as a T1-type digital carrier. One typical earlier T1-type digital carrier, for example, supports twenty-four fullduplex voice channels using just two pain of UTP (one pair for each transmission direction). Repeaters are spaced at intervals along the line to regenerate the transmitted digital signal.

A T1-type carder employs time division multiplexing (TDM) in which a transmission medium is shared in time. In one type of TDM carder system 30, shown in the illustrative drawings of FIG. 1, multiple analog units 32 are connected to a bank of channel units 34. Each channel unit 34 includes a coder for convening between analog and digitally coded samples. A time division multiplexer 36 interleaves the coded samples in time sequence to produce a multiplexed signal on a multiplexed output line 38. A multiplexed channel bank and a repeated multiplexed line together constitute the digital TDM carrier system 30.

The data format in a typical TDM system comprises data frames that include a sequence of time slots, each containing at least one sample from one of the channels served by the carder system. Frames are repeated at the sampling rate. Each channel occupies the same relative position in successive frames. The TDM process assigns a time slot to each channel in each frame and transmits the frames on a high-speed repeatered TDM bus. In this manner, information from multiple channels is concentrated onto a TDM bus.

More recently, T1-type carder systems have been developed which include the capability to detect bit errors. For example, an extended superframe format (ESF) has been developed in which a cyclic redundancy check (CRC) code is transmitted together with each extended superframe. The CRC code is generated by a sending channel station based upon data to be sent in ESF, and is transmitted together with that dam as part of the extended superframe. A remote receiving station generates its own CRC based upon the received data and compares it with the received CRC in order to detect errors.

For a more complete discussion, refer to, *The McGraw-Hill Telecommunications Factbook* by Joseph A. Pecor, et at., published by McGraw Hill, Inc., 1993.

Wireless Telecommunication

Wireless telecommunication for voice, data and other services is one of the most rapidly developing sectors of telecommunications. Numerous cellular telephone system architectures have been developed, and standards have been proposed for shared access to the cellular telephone radio communications spectrum. There are a number of communications techniques employed to link mobile terrestrial subscriber units, cell base stations and central mobile telephone switching offices. A telephone system architecture in which a portion of the connection between a local telephone or subscriber unit and a PSTN, or central office, involves a "wireless" (radio) connection is commonly referred to as a wireless local loop architecture.

The time division multiple access (TDMA) interim standard referred to as EIA/TIA/IS-54-A dated March 1991, entitled, "Cellular System Dual-Mode Mobile Station-Base Station Compatibility Standard", has been proposed in the U.S.A. by the Electronics Industry Association/ Telecommunications Industry Association. The TDMA standard referred to as RCR STD-27B, issued Apr. 30, 1991, Rev. A Jan. 30, 1992, Rev. B Dec. 10, 1992, entitled, "Personal Digital Cellular Telecommunication System RCR Standard" (the "PDC Standard"), has been proposed in Japan by the Research & Development Center for Radio Systems. Code division multiple access (CDMA) in cellular telephones is addressed in U.S. Pat. No. 4,901,307 entitled, "Spread Spectrum Multiple Access Communication System Using Satellite or Terrestrial Repeaters", issued to Gilhousen, et al., on Feb. 13, 1990. Much of the earlier work in TDMA and CDMA telephone communications had its genesis with satellite communications which are explained in depth in, *Digital Communications by Satellite*, by James J. Spilker, Jr., Prentice Hall, Inc., Englewood Cliffs, N.J., 1977.

The illustrative drawing of FIG. 2 shows a cellular system 40 in which a mobile terrestrial subscriber unit 42 communicates by radio with a cell base station 44 within a geographic cell region 45. There can be numerous cell base stations, each associated with a different geographical region called a cell, and each handling calls from subscriber units operating in its associated cell. The ceil base station, in turn, communicates via guided media 46 with a mobile switching center (MSC) 48 that accesses the PSTN 50. A cell base station may simultaneously communicate with numerous subscriber units like the one shown using TDMA or CDMA techniques, for example. A transmission medium capable of accurately transmitting high data rate signals ordinarily is employed to interconnect cell base stations and the PSTN. T1-type carrier systems, high bit rate microwave links or fiber optic cables all are well suited to the task.

In some situations modem high data capacity links, such as T1-type carriers, are not available to interconnect a cell base station 44 with the PSTN 50. For example, in developing countries the cell base station may be part of a relatively low bit rate local subscriber loop that employs twisted pair (UTP or STP). As a result, it may be difficult to transmit higher data rate signals between a cell base station 44 and the PSTN 50. Unfortunately, the time and expense involved in installing high capacity (high bit rate) local subscriber loop lines to correct the problem can be prohibitive. In addition, for example, local regulation governing the use of the available frequency spectrum may preclude the use of high bit rate microwave links.

Thus, there has been a need for a method and an apparatus to permit wireless subscribers to communicate with the PSTN through a low bit rate system. The present invention meets this need.

SUMMARY OF THE INVENTION

The present invention provides a method of cellular telephone communication among a subscriber unit, a base station and a switch controller. In one aspect of the invention, communication proceeds from the subscriber unit to the controller. In that aspect, communication signals are digitally encoded in a compressed form at the subscriber unit. A radio forward error correction code (FEC) is generated at the subscriber unit to protect the encoded communication signals during radio transmission. The encoded communication signals together with the radio FEC are transmitted by radio from the subscriber unit to the base station. The transmitted encoded communication signals are error corrected at the base station using the radio FEC. Then, at the base station, wire FEC is generated to protect the encoded communication signals during transmission to the controller. The encoded communication signals together with the wire FEC are transmitted to the controller where error correction of the encoded communication signals is performed using the wire FEC. The communication signals are then decoded at the controller into an uncompressed form.

The encoded communication signals are protected using radio FEC during radio transmission and are protected using wire FEC during transmissions in which the bit error rate (BER) approximates the wire BER. Moreover, the errors in the encoded communication signals incurred during radio transmission are corrected after the completion of the radio transmission, and wire FEC is applied to the error corrected communication signals prior to transmission via a medium that experiences an error rate that approximates the wire BER. This technique advantageously avoids the compounding of error transmissions in the course of radio and wire transmissions. As a result, a high capacity wireless system that uses radio FEC can be used in conjunction with a low bit rate system that experiences a wire BER without significant degradation of performance.

These and other purposes and advantages of the invention will be better appreciated from the following detailed description of the invention.

DETAILED DESCRIPTION OF THE DRAWINGS

DETAILED DESCRIPTION OF THE PREFERRED EMBODIMENT

The present invention comprises a novel system and method to improve wireless subscriber access to a public switched telephone network via a low bit rate local subscriber loop. The following description is presented to enable any person skilled in the art to make and use the invention, and is provided in the context of a particular application and its requirements. Various modifications to the preferred embodiment will be readily apparent to those skilled in the art, and the general principles defined herein may be applied to other embodiments and applications without departing from the spirit and scope of the invention. Thus, the present invention is not intended to be limited to the embodiment shown, but is to be accorded the widest scope consistent with the principles and features disclosed herein.

Figure 1:
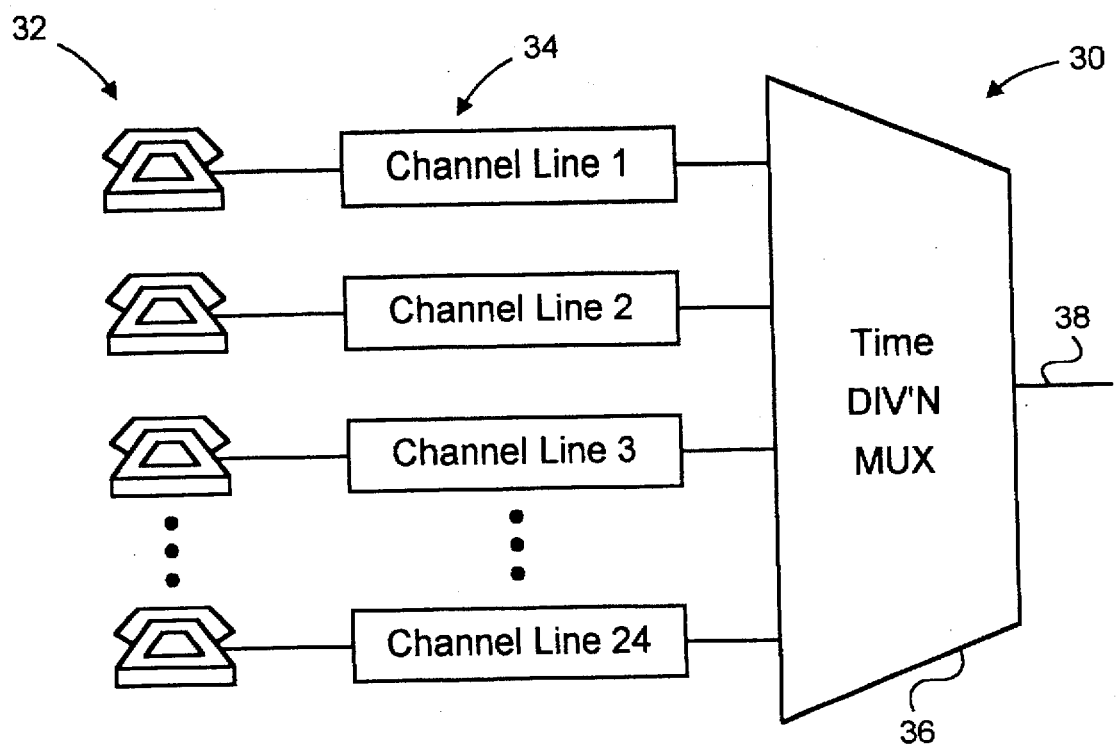
FIG. 1 is a generalized block diagram of a representative conventional time division multiplexing (TDM) system of a T1-type carrier.
Figure 2:
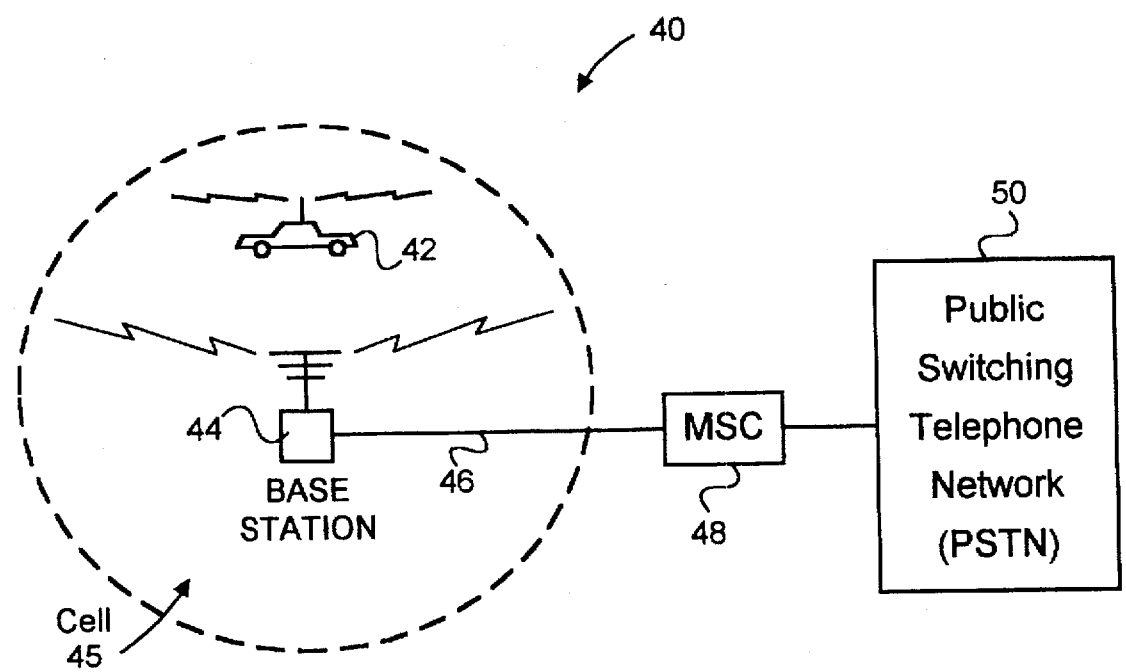
FIG. 2 is a generalized block diagram of a conventional cellular communication system which includes a wireless subscriber unit, a cell base station and a mobile switching center interconnected with a public switched telephone system (PSTN)
Figure 3:
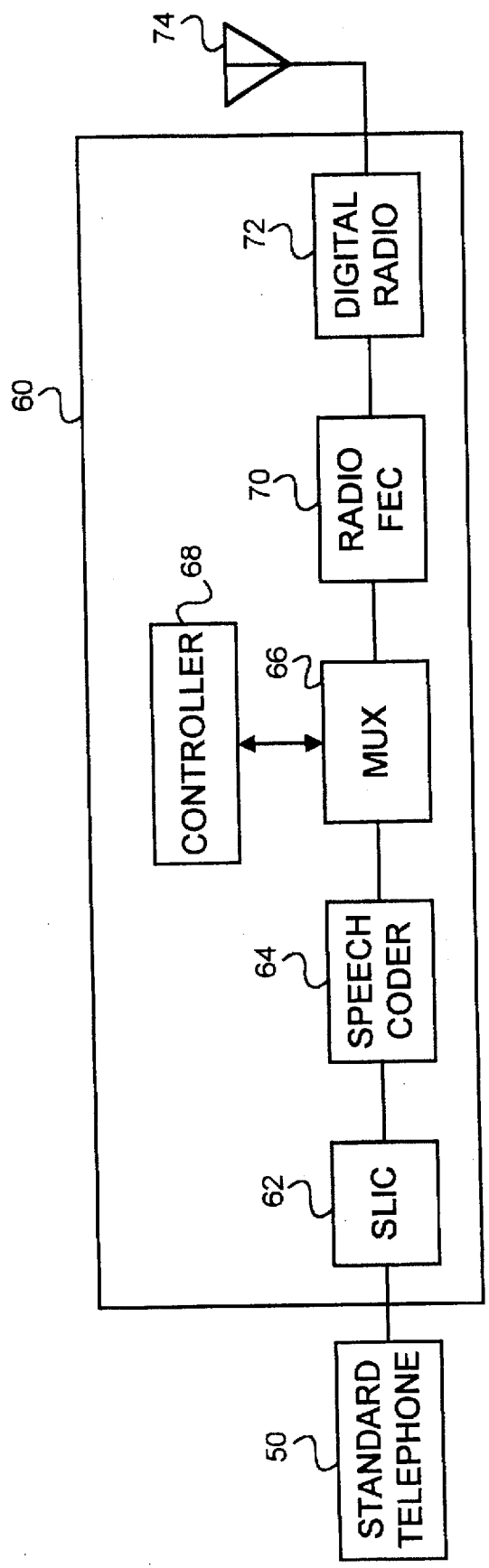
FIG. 3 is a block diagram of a subscriber unit in accordance with a present embodiment of the invention connected to a conventional telephone.
Figure 4:
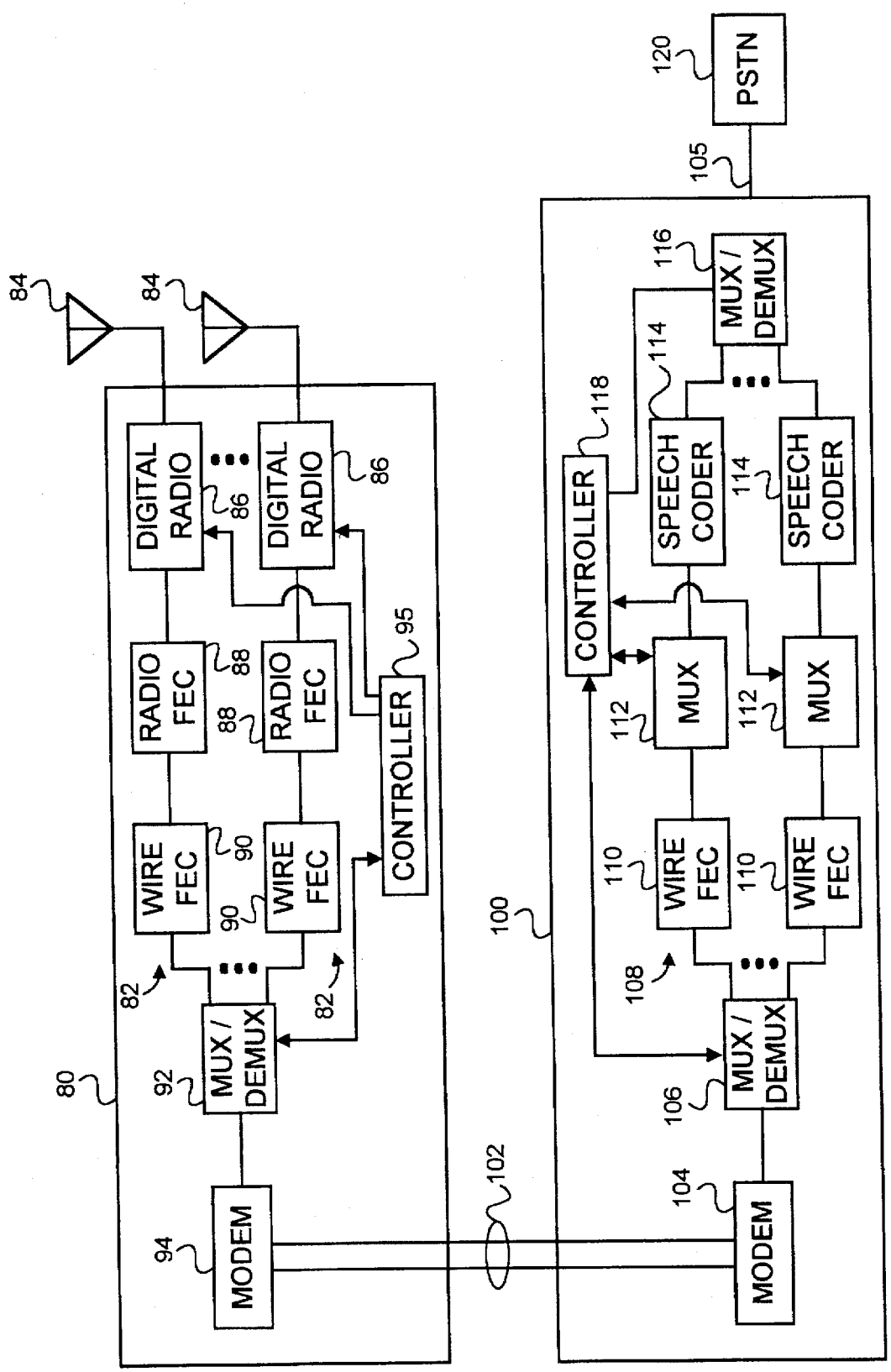
FIG. 4 is a block diagram of a cell base station in accordance with a present embodiment of the invention and a block diagram of a radio and switching controller in accordance with a present embodiment of the invention.

Referring to the illustrative drawing of FIG. 3, there is shown a block diagram of a wireless subscriber unit 60 in accordance with a presently preferred embodiment of the invention. In FIG. 4, there are shown a block diagrams of a cell base station 80 and a radio and such controller (RSC) 100 in accordance with a presently preferred embodiment the invention. A cellular telephone system in accordance with the present embodiment covers a collection of discrete geographically dispersed regions referred to as cells. Such a cellular system includes a plurality of base stations 80 (only one shown). Each base station can simultaneously communicate by radio with multiple wireless subscriber units 60 (only one shown) within a cell served by the base station. The base stations all are connected to the RSC 100 which communicates with the Public Switched Telephone Network (PSTN) 120. The RSC 100 is interconnected with the PSTN 120 by a T1/E1 wire 105.

In a current embodiment, each cell base station 80 is interconnected with the RSC 100 by a single copper twisted pair wire 102, although a second twisted pair often is present in case the first twisted pair breaks down. Alternatively, the cell base station 80 can be interconnected with the RSC 100 by a relatively inexpensive low bit rate (approximately 384 kbps or less in a preferred embodiment) microwave link. In one implementation of the invention, MDS 450D or 950D series radios produced by Microwave Data Systems of Rochester, N.Y. form the microwave link. Microwave linkages are feasible when microwave antennas can be set up in line-of-site relationships to each other. Both copper wire interconnections and a microwave link can be used in a single cellular telephone system. For example, one base station might be connected to the RSC by copper wire twisted pair, and another base station might be connected to the RSC by a microwave link. A fiber optic link also Could be employed consistent with the invention. Another alternative is to interconnect the cell base stations 60 with the RSC 80 using satellite communications. Satellite communications may be more practical and cost effective in rugged terrain, for example, where line-of-sight communications are not feasible. Signals are relayed by the satellite which is high above the terrain.

A telephone system constructed in accordance with the invention uses compressed speech signals on a low bit rate local subscriber loop. The use of compressed speech permits many more conversations to be handled simultaneously. The use of low bit rates increases the available transmission power per bit. Increased power per bit provides greater transmission distance with fewer errors. Generally, any bit rate less than the T1 standard bit rate of 1.544 Mbps is considered to be a low bit rate for the purposes of this invention.

The system and method of the present invention reduces the bit error rate (BER) of communications between wireless subscriber units and a PSTN 120 using low bit rate communications. The reduced BER is achieved by protecting signals transmitted between base stations 80 and subscriber units 60 using radio forward error correction (FEC) and by protecting signals transmitted between base stations 80 and RSC 100 using wire FEC. The use of separate error correction schemes for radio and for low bit rate (wire) transmissions avoids a larger in BER that otherwise might occur if a single error correction scheme was used for both the radio and low bit rate transmissions.

The term "radio FEC" as used herein refers to radio forward error correction schemes used to protect signals that suffer a BER in the range of that of typical radio communications. Typically, the radio BER is on the order of $10^{-2}$. The term "wire FEC" as used herein refers to wire forward error correction schemes used to protect signals that suffer a BER in the range of typical wire communications. Ordinarily, the wire BER is on the order of $10^{-6}$–$10^{-8}$.

Wire FEC, however, is not limited to use in wires. It may be applied to microwave links or satellite links, for example, which can suffer a BER in the same range as wire links. Generally, when a semi-guided (e.g., microwave) or unguided (e.g., satellite) link is used instead of a wire connection, the link is implemented with a BER that approximates the wire BER. Thus, for example, bits transmitted over semi-guided or unguided media installed in place of wire typically are transmitted at sufficiently high power levels to fall closer to the wire BER range than the radio BER range. The objective is to replace the wire without loss of performance. Hence, links that exhibit only the wire BER generally are preferred since there is no significant loss of performance from using a semi-guided or unguided medium instead of a guided medium, e.g., wire. Thus, wire FEC can be used to protect guided, semi-guided or unguided signals that exhibit a wire BER.

Each wireless subscriber unit 60 is connected to a standard telephone 50. Each subscriber unit 60 includes a Standard Line Interface Circuit (SLIC) 62 as described by FCC Regulations Part 68. The SLIC 62 provides industry standard hardware/software required to interface to the telephone 50. The functions controlled by the SLIC 62 include such routine operations as convening voltage and current levels, causing the telephone to ring, monitoring on-hook/off-hook operations and diagnostics. Each wireless subscriber unit 60 further includes a speech coder 64, a multiplexer 66, a controller 68, a radio FEC 70, a digital radio 72 and an antenna 74, all connected as shown.

It will be appreciated that an answering machine or facsimile machine, for example, may be substituted for the telephone 50 consistent with the invention. Moreover, it is possible to combine some of the standard telephone functions (speaker, microphone, dial pad) into the subscriber unit 60 and thereby eliminate the need for the SLIC 62. Such a combination could achieve cost savings and reduced size.

Each base station S0 includes multiple base station radio channels 82 (only two shown). Each radio channel 82 includes an antenna 84, a digital radio 86, a radio FEC 88 and a wire FEC 90. Each base station further includes a multiplexer/demultiplexer 92 and a modem 94. Each different channel 82 transmits and receives signals at a different radio frequency. The operating radio frequency of the different channels, however, can be changed dynamically. Each radio channel 82 of a given base station communicates with wireless subscriber units 60 within the base station's cell that are transmitting and receiving at that channel's frequency. In a presently preferred embodiment, them are either four or five radio channels 82 per base station, each of which can communicate simultaneously with three subscriber units 60 using three slot TDMA in accordance with the PDC Standard. The multiplexer/demultiplexer 92 switches signals between different base station channels 82 and the modem 94. The modem 94 communicates with the RSC 100 via connection 102.

The RSC 100 includes multiple modems 104 (only one shown), each interconnected with the modem 94 of a different base station 80 via an interconnect 102. A multiplexer/ demultiplexer 106 switches signals between the modems 104 and multiple RSC channels 108. Each RSC channel 108 includes a wire PEC 110, a multiplexer 112 and a speech coder 114. A multiplexer/demultiplexer 116 switches signals between the multiple RSC channels 108 and the T1/E1 wire 104 coupled to the PSTN 120. A controller 118 is connected to the multiplexers 112 and tomultiplexer/demultiplexer 116 as shown.

In a presently preferred embodiment, the modems 94,108 are wire modems that communicate over a twisted pair wire connection 102 using a bit rate of approximately 144 kbps. In an alternate embodiment mentioned above, a microwave link is used in place of the modem pair 94,108. The microwave bit rate capacity in the alternate embodiment is approximately 384kbps. Hence, a higher volume of subscriber unit traffic can be handled using a microwave link. In a presently contemplated embodiment using a microwave link, each cell base station 80 includes ten radio channels, each of which can simultaneously communicate with ten subscriber units.

The speech coders 64,114 employ vector sum excitation linear prediction (VSELP) technique described in Proposed EIA/FFIA Interim Standard, "TDMA Dual-Mode Mobile Station-Base Station Compatibility Standard" IS-54 Rev-A identified above which is incorporated herein by this reference. VSELP techniques are well known. Particular VSELP techniques are generally described in U.S. Pat. No. 4,896,361, entitled, "Digital Speech Coder Having Improved Vector Excitation Source" issued to Gerson on Jan. 23, 1990 and in U.S. Pat. No. 4,817,157 entitled, "Digital Speech Coder Having Improved Vector Excitation Source" issued to Gerson on Mar. 28, 1989, each of which is incorporated herein by this reference. Although, the speech coders of the current embodiment achieve signal compression coding using VSELP techniques, there are alternate speech coder techniques that can be employed consistent with the invention. For example, a PSI-CELP voice coder in accordance with the RCR-27C Standard could be employed; an IMBE voice coder under the IMARSAT Standard could be used; or a QCELP voice coder under the IS-95 Standard could be used.

The radio FEC 70, 88 of the presently preferred embodiment employs a convolutional coder. In the current embodiment, a 9/17 rate convolutional coder is employed. Convolutional coders are well known. For example, convolutional code structures are described by Spilker, Jr. in *Digital Communications by Satellite* at pages 456–458. The particular radio FEC techniques used in the present implementation are described in Sections 5.1–5.4 of the "PDC Standard" identified above, which is incorporated herein by this reference. Each radio FEC includes an encoder and a decoder. The radio FECs 70, 88 in the subscriber unit 60 and the base station 88 are essentially identical. Hence a single explanation is provided below which applies to each.

Figure 5A:
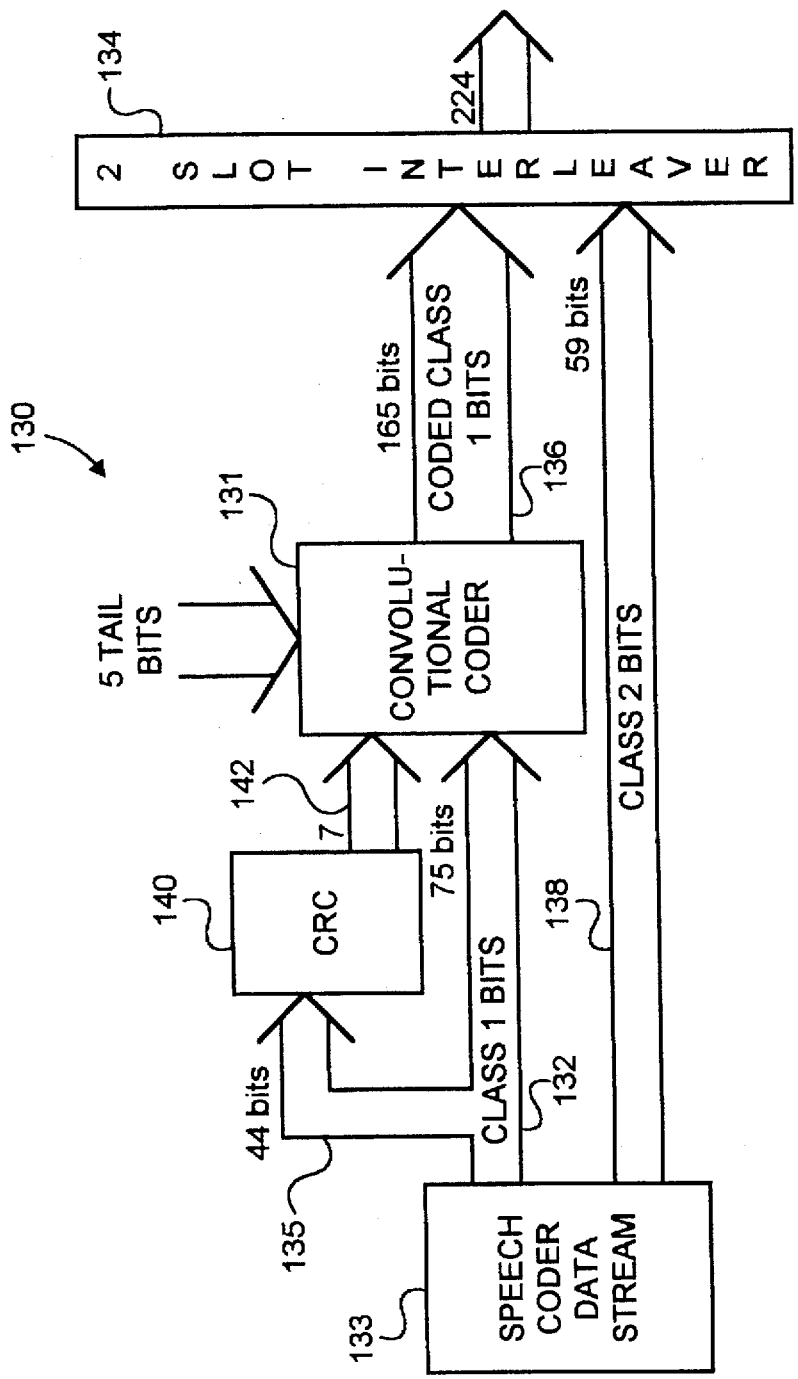
FIG. 5A is a block diagram showing details of a radio FEC encoder of the embodiment of FIG. 4.

FIG. 5A is a block diagram, taken directly from the PDC standard, of a radio FEC encoder 130 used in a current embodiment of the invention. In accordance with the PDC Standard, the speech coder 66,114 segregates compressed speech bits into class 1 bits and class 2 bits. Class 1 bits, which are more important to speech perception than class 2 bits, are protected with radio FEC. The class 2 bits are not. Classification of bits under the PDC Standard is not essential to the invention, and the classification criteria will not be discussed in detail herein.

The radio FEC encoder 130 employ three mechanisms, in accordance with the PDC Standard, to mitigate speech channel errors. First, a 9/17 convolutional coder 131 protects the more vulnerable class 1 bits 132 of the speech coder data stream 133. In the subscriber unit 60, the data stream is provided by the speech coder 64. In the base station 80, the data stream is provided by the wire FEC 90. Second, a cyclic redundancy check (CRC) circuit 140 computes a CRC code 142 over the most perceptually significant class 1 bits 135 of the speech coder data stream. Third, an interleaver 134 interleaves the code class 1 data 136 plus the class 2 data 138 for each speech coder frame over two time slots to mitigate the effects of Rayleigh fading. As explained more fully below, error correction is applied at a decoder portion 146 of a receiving radio FEC, and the CRC bits are checked to determine whether the most perceptually significant bits were received properly.

More specifically, the operation of the radio FEC encoder 130 is as follows. In accordance with the PDC standard, each speech coder frame includes 134 bits: (75) bits for class 1 and (54) bits for class 2. A 7-bit CRC is used for error detection purposes and is computed over the (44) most perceptually significant bits of class 1 for each speech frame as shown in FIG. 5A. The purpose of the 7-bit CRC is to detect when error correction is unable to correct all of the channel errors occurring in the transmission of the 44 most perceptually significant bits. Since an error in any of these 44 bits can cause a serious deterioration of speech quality, it is desirable not to use these 44 bits if they are known to be incorrect. If an uncorrectable error is detected, it is preferable to replace the received data for this frame with data from a previous frame. This effectively masks the occurrence of isolated frames of data in error so that there is almost no perceived reduction in speech quality.

The convolutional coder 131 employs a rate 9/17 convolution code with a memory length of 5 (R=9/17, m=5). The convolution code is applied to (75) bits of the (134) bits of the speech coder output, the 7 bits of CRC and 5 overhead bits required by the decoder. These (87) bits are encoded to (165) bits by the convolutional processing. The two slot interleaver 134 time multiplexes the data of one 20 ms frame into two adjacent time slots. Half of a frame's bits are sent in the first time slot, and the rest are sent in the subsequent time slot.

The PDC Standard specifies that all three radio FEC encoding mechanisms described with reference to FIG. 5A should be employed for speech encoding. Moreover, the PDC Standard requires that control data, discussed below, be encoded using well known CRC and BCH coding techniques. It will be appreciated, however, that radio FEC encoding can be achieved consistent with the invention using alternate techniques such as those discussed below. What is important is that radio FEC be employed which is consistent with the particular requirements of whatever alternate approach is taken to implement the invention.

Figure 5B:
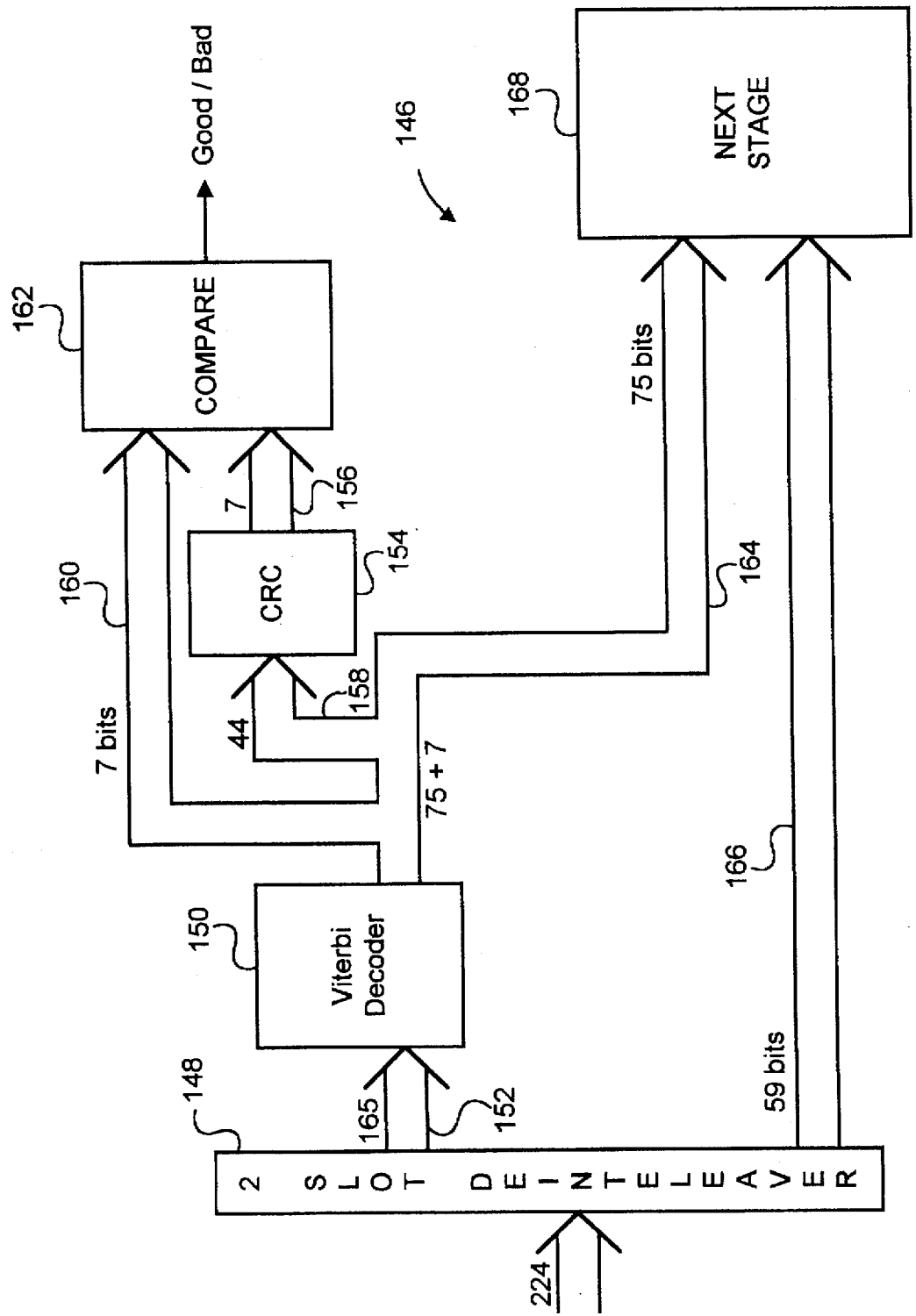
FIG. 5B is a block diagram showing details of a radio FEC decoder of the embodiment of FIG. 4.

Referring to the illustrative drawing of FIG. 5B, there is shown a block diagram of the decoder potion 146 of the radio FECs 70,88 of the presently preferred embodiment. First, frame of data is deinterleaved by deinterleaver 148. Next, a Viterbi decoder 150 decodes the convolutionally encoded data stream 152. The choices of decoding algorithm impact the coding gain and the computational complexity. In order to achieve acceptable decoding capability, a Viterbi algorithm is used in the preferred embodiment. However, alternate decoding techniques may be employed consistent with the invention. The decoded received bits are provided to a a CRC circuit 154 calculates a new set of CRC bits 156 using the most perceptually important decoded class 1 bits 158. These new CRC bits 156 are compared by a comparison circuit 162 to the decoded received CRC bits 160. If the two sets of CRC bits differ, then the repeat frame method is employed to mask the erroneous dam.

Basically, the Viterbi decoder 150 is the counterpart of the convolutional encoder 131. The Viterbi decoder performs error correction. The CRC circuit 154 is used to detect errors that escape correction by the Viterbi decoder. When the comparison circuit 162 detects a mismatch in the decoded CRC bits 160 (which were generated by CRC circuit 140) and the CRC bits 156 (generated by the CRC circuit 154), then bad data is signaled, and bad-frame masking is employed as explained above. The decoded corrected class 1 bits 164 and the class 2 bits 166 then are provided to the next stage 168. In the subscriber unit 60, the next stage is the speech coder 64. In the base station, the next stage is the wire FEC 90.

Alternatively, for example, the radio FEC 70, 88 could be implemented as a double bit error correction coder such as a BCH coder or a Reed-Solomon Coder or some combination thereof. The objective is to provide the equivalent of approximately 2–3 of coding gain to compensate for the inability to transmit at full power. For example, a bit error rate (BER) at some arbitrary power level of "x" without such radio FEC would be approximately the same as the BER with such radio FEC at a power level of "½x". In cellular telephone systems, high power transmissions often are not feasible because of the risk of inter-cellular interference, battery life limitations and the cost of more powerful transmitters.

Figure 6A:
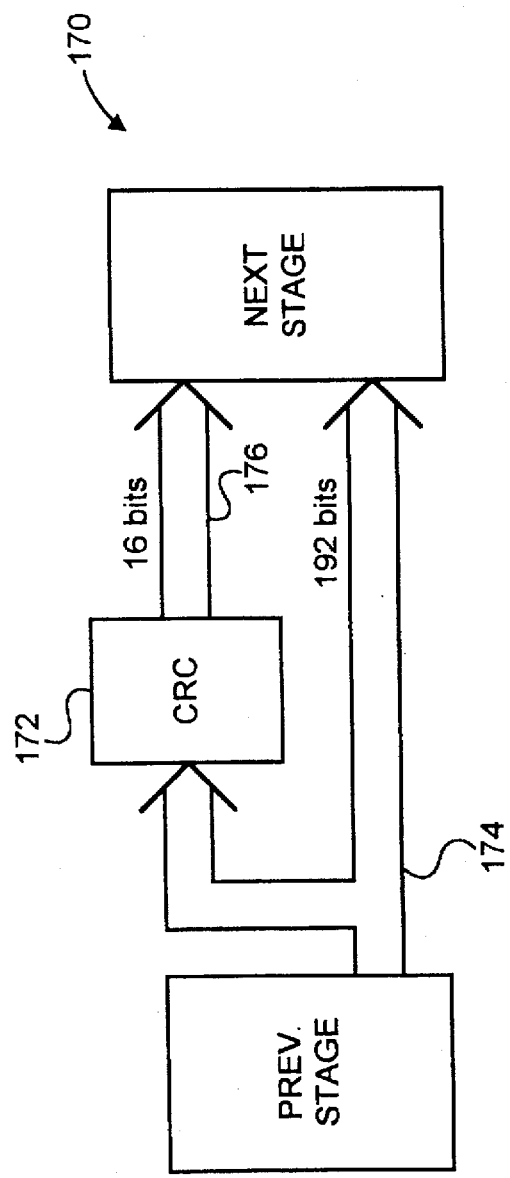
FIG. 6A is a block diagram showing details of a wire FEC encoder of the embodiment of FIG. 4.

Referring to the illustrative drawings of FIG. 6A, there is shown a block diagram of a wire FEC encoder 170 in accordance with a present embodiment of the invention. Essentially, it consists of a block coder (BCH) 172 that computes a CRC code. Identical wire FEC encoders are employed in the base station 80 and the RSC 100. Hence, the single explanation that follows applies to each. In the base station, the previous stage is the radio FEC 88. In the RSC 100, the previous stage is the speech coder 114. The wire FEC encoder 170 receives (192) bits 174 and computes a 16-bit BCH code 176. The received (192) bits 174 and the computed (16) BCH bits 176 are delivered to the next stage.

Figure 6B:
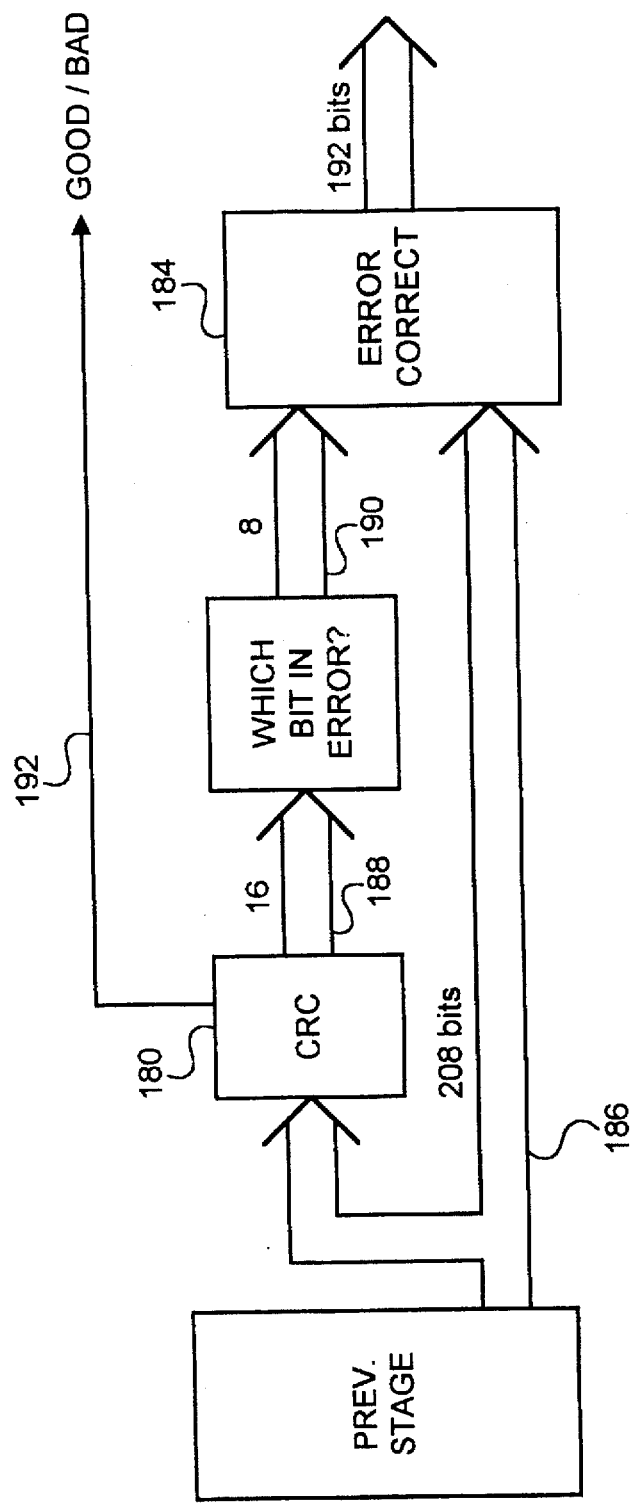
FIG. 6B is a block diagram showing details of a wire FEC decoder of the embodiment of FIG. 4.

Referring to the illustrative drawings of FIG. 6B, there is shown a block diagram of a wire FEC decoder 178 in accordance with a present embodiment of the invention. It includes a block coder 180, a bit-in-error detector 182 and an error corrector 184. Identical wire FEC decoders 178 are used in the base station 80 and the RSC 100. Hence, the following explanation applies to both. The wire FEC decoder 178 receives (208) bits. The block coder computes a 16-bit CRC code 188. The bit-in-error circuit 182 provides (8) bits 190 that indicate which (if any) bit is in error. The error corrector circuit 184 corrects the error (if any) if it is a correctable error. If the block coder 180 determines that more than one bit is in error then it provides an indication on line 192 that the error is uncorrectable, and the received data is bad. The wire FEC provides (192) bits as an output on line 195.

Hence, the wire FECs 90, 110 of the presently preferred embodiment achieve single bit error correction and multi-bit error detection through well known BCH code techniques. Such techniques are described in general by Thomas J. Lynch in *Data Compression Techniques and Applications* published by Van Nostrand Reinhold, 1985, at page 315 and in the references cited in the notes therein. Alternatively, Reed-Solomon codes or a combination of Reed-Solomon and BCH codes could be employed. Still another approach involves convolutional codes, although convolutional codes may require more bits, and therefore, may be less desirable in some applications.

Those skilled in the art will appreciate that, although the discussion and drawings of FIGS. 3–6B speak in terms of separate coders and decoders for each of the voice coder, wire FEC and radio REC, in each case there is actually one programmable subsystem that acts as both a coder and a decoder. For example, in the current implementation, discussed below with reference to FIG. 10, there are multiple VOX processors 114-1 in the RSC 100. Each VOX processor serves as both a voice decoder and a voice encoder. Moreover, in FIG. 10, there are shown multiple RFMs 82-1 in the base station 80. Each RFM includes circuitry that performs both wire FEC encoding and decoding and that performs both radio FEC encoding and decoding.

Furthermore, it will be appreciated from the discussion below in relation to FIG. 10, that the wire FEC coders/decoders and the radio FEC codes/decoders are implemented using general purpose digital signal processing circuitry. Hence, the drawings in FIGS. 5A–B and 6A–B represent the structure of a DSP programmed to perform the recited coding and decoding processes.

The digital radios 70, 76 employ the TDMA scheme described in the PDC Standard which is incorporated herein by this reference. Specifically, the TDMA scheme is 42 kbps full duplex 3 slot TDMA with a common control channel. The digital radios employ well known quadrature phase techniques. *Modern Quadrature Amplitude Modulation* by William Webb and Lajas Hanzo, IEEE Press, 1994, provides a useful overview of basic quadrature amplitude and phase modulation principles. More specifically, the digital radios use well-known π/4-shifted DQPSK modulation techniques described in the PDC Standard. The merits of a π/4-shifted DQPSK modulation are well known. For example, the π/4 phasing reduces the linearity required in the transmitter. Differential modulation reduces the requirement for coherent detection. Quadrature spacing permits transmission of approximately twice as many bits while increasing power only approximately √2 (approximately 40%). Phase shift keying is routine and well known. Alternative modulation techniques can be employed without departing from the invention. For example, offset-QPSK could be employed. Offset-QPSK is described in U.S. Pat. No. 4,720,839, entitled Efficient Data Transmission Techniques, issued to Kamilo Feher, et at. which is incorporated herein by this reference and is described by Webb and Hanzo.

Moreover, as explained below, instead of exclusively employing voice coders on each of the RSC channels, it is within the scope of the invention to provide data coders or fax coders, for example, on one or more of the RSC channels. The use of different coders permits the delivery of a variety of different services such as, voice, data and facsimilie (FAX). Thus, it is possible to transmit a variety of different types of communication signals using a system in accordance with the invention.

Alternatively, radios using CDMA or a frequency division multiple access (FDMA) could be employed without departing from the invention. In CDMA, radio FEC convolutional codes are inherently built into the modulation scheme in order to measure interference and to adjust transmission power levels accordingly. Thus, CDMA employs radio FEC techniques not only to detect and correct errors in radio transmission, but also to adjust radio transmission power levels based upon the radio BER.

The modems 94, 104 employed in the preferred embodiment conform to the CCITT U Interface Standard, which is explained in Study Group XVIII Recommendation I.430, "Basic User Network Interface Layer Specification", AP VIII. 97E, June 1984, pp. 152–194 which is incorporated herein by this reference. In the present embodiment, these are wire modems which transmit at 160 kbps using 2B1Q modulation. An MC 145572 integrated circuit, produced by Motorola Corp. of Sehaumburg, Illinois, is used to achieve this function. In a current embodiment of the invention, the copper wire twisted pair connection 102 currently can be up to approximately 8,000 meters in length unless repeaters are employed, in which case the length may be greater. If a microwave link is employed the distance between the cell base station 80 and the RSC 100 often can be greater, up to 80 km in certain current implementations. Satellite communications can interconnect base stations and controllers over even greater distances.

The PSTN 120 is a standard telephone switch that may be produced by any one of a number different manufacturers such as the S12 produced by Alcatel of France or the AT&T No. 5 ESS. The pair of copper wires that comprise the T1/E1 wire 105 in a current embodiment can be up to 2,000 meters in length.

In operation, during transmission from a subscriber unit 60 to the PSTN 1205 a user of a subscriber unit speaks into the telephone 50. Speech is digitized and compressed by the speech coder 64. A standard telephone system typically transmits speech at 64 kbps. In the present embodiment, speech is compressed (or encoded) from approximately 64 kbps to approximately 8 kbps. The radio FEC encoder 130 generates a radio forward error correcting code which protects the compressed (encoded) voice signal from errors during wireless transmission to the cell base station 80. The digital radios 72 and 86 transmit and receive the compressed voice signals wrapped in radio forward error correction code (ECC) generated by a radio FEC encoder 130 in the subscriber unit 60.

A radio FEC decoder 146 in the receiving base station channel 82 detects and corrects errors in the signal received by a radio 86. A wire FEC encoder 170 in the receiving radio channel 82 then generates a wire forward error correcting code which protects the compressed voice signal from errors during transmission from the cell base station 80 to the RSC 100. A wire FEC decoder 178 in the receiving RSC channel 108 detects and corrects errors in the signal transmitted by the base station 80. A speech coder 114 in the receiving RSC channel 108 decompresses the speech signal.

The multiplexer/demultiplexer 92 interleaves the wire FEC protected compressed (encoded) speech signals onto the connection 102. In the RSC 100, the multiplexer/demultiplexer 106 switches the signals onto an available RSC channel 108. A wire FEC decoder 178 in the selected RSC channel 108 detects and corrects errors in the compressed speech signal. Speech coder 114 decompresses the error corrected compressed speech signal. Multiplexer/demultiplexer 116 then switches the decompressed speech signals onto a T1/E1 wire. The bit rate on a typical T1 wire is 1.544 Mbps. The bit rate on a typical E1 wire is 2.048 Mbps.

The RSC channel 108 may be selected, for example, based upon factors such as availability, type of service required and coding standard used to code the communication signals. It is possible, consistent with the invention, for example, for an RSC (not shown) to implement voice, FAX and data coders. Each different type of coder would represent a different type of services. Different RSC channels, for example, could be used to provide different coder services: FAX modem on one channel, data modem on another, and voice coding on yet another channel. Moreover, different voice standards (algorithms), FAX modem standards or data modem standards may be implemented in different channels. Thus, it may be necessary to select an RSC channel 108 based upon the type of communications signal (voice FAX or data) and based upon the coding standard used to code the signal.

The above description is for transmission from a subscriber unit 60 to the PSTN 120. However, those skilled in the art will readily understand the transmission of signals in the opposite direction, from the PSTN 120 to a subscriber unit 60. Specifically, uncompressed speech signals are transmitted from the PSTN 120 to an RSC channel 108. A speech coder 114 compresses the speech signal. A wire FEC encoder 170 wraps the compressed speech signal in ECC. The compressed signal and its wire forward error correction code bits are transmitted to a radio channel 82 in the cell base station 80. A wire FEC decoder 178 in the receiving cell base station 80 detects and corrects errors. Then a radio FEC encoder 130 wraps the error corrected compressed signal in radio forward error correction code. A base station radio 86 transmits the compressed signal plus radio ECC to a subscriber unit 60 where a radio FEC decoder 146 detects and corrects errors and a speech coder 64 decompresses the compressed speech signal.

The controllers 68, 118 in the subscriber unit 60 and the RSC 100 are responsible for call management functions in accordance with SLIC and PDC Standards. For example, control data is sent between the RSC 100 and the subscriber units 60 via base stations 80 in order to initiate, maintain, terminate and monitor calls pursuant to the PDC Standard. Furthermore, for example, the controller 68 in the subscriber unit 60 can monitor subscriber unit functions such as battery life. The multiplexers 66, 112 in the subscriber unit 60 and the RSC 100 serve to control the provision of control data and speech on the various radio and RSC channels 82, 108.

The use of both radio FEC and wire FEC enhances the ability to detect and correct errors in the transmitted signals. With both radio FEC and wire FEC, the total bit error rate (BER) is approximately the sum of the BER from the radio transmission between subscriber unit 60 and base station 80 plus the BER from the transmission between the base station 80 and the RSC 100. In contrast, for example, if the wire FEC was eliminated, and only radio FEC was used, then the overall BER would result from the total accumulation of noise during transmission between subscriber unit and base station and during transmission between base station and controller.

Noise is quantified in a signal to noise (SNR) measure. The larger the SNR, the smaller the BER. Hence, if separate radio and wire FECs were not used, then the overall BER would approximate the BER of the sum of the SNRs instead of approximating the sum of the BERs. This is important. In general, radio modems, wire modems and microwave links have the property that a relatively small decrease in SNR results in a relatively large decrease in BER. For example, an increase in SNR of 3 dB (double the noise power) could result in an increase in BER by a factor of ten. Given the above-described property of radio and wire modems and microwave links, the sum of the BERs generally will be smaller than the BER of the sum of the SNRs. The use of separate radio FEC and wire FEC, therefore, results in a lower BER which approximates the sum of the radio BER and the wire BER rather than the higher BER that approximates the BER of the sum of the SNRs of the radio transmission and the "wire" transmission.

In a presently preferred embodiment of the invention, digital information is transmitted between the base stations 80 and individual subscriber units 60 using the TDMA scheme described in the PDC Standard. As mentioned above, the standard uses a 42 kops full duplex 3 slot TDMA with a common control channel. Each slot is 6.7 msec in duration.

Figure 7:
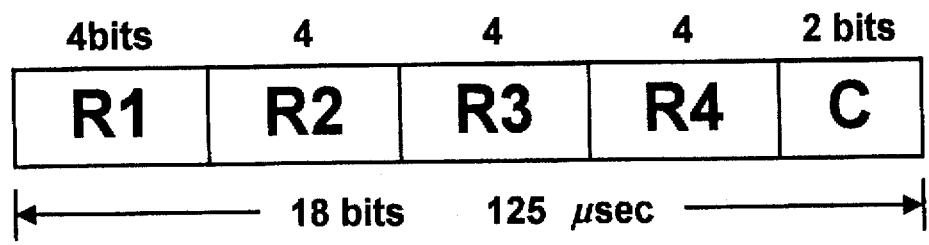
FIG. 7 is a timing diagram illustrating the interleaving of radio and control channel information during communications between the base station and the radio and switch controller (RSC) of the embodiment of FIG. 4.

Each base station 80 communicates with the RSC 100 over the connection 102 using a TDM scheme implemented using multiplexers/demultiplexers 92 and 106. In the present embodiment, the multiplexer/demultiplexers 92, 106 interleave the four subscriber unit radio channels and one control radio channel during successive 125 microsecond segments. The operation of the multiplexer/demultiplexers can be understood through reference to the illustrative drawings of FIGS. 7–9. FIG. 7 shows a representation of the four radio channels and the one control channel that are interleaved during a single 125 μsec time segment. Eighteen bits are transmitted between the base station 80 and the RSC 100 during each interleaved time segment: four bits per radio and two control bits. The controllers 95, 118, for example, use the control bits to select a channel, read back statistics concerning radio quality, put radios into a maintenance mode or to set radio frequencies.

Figure 8:
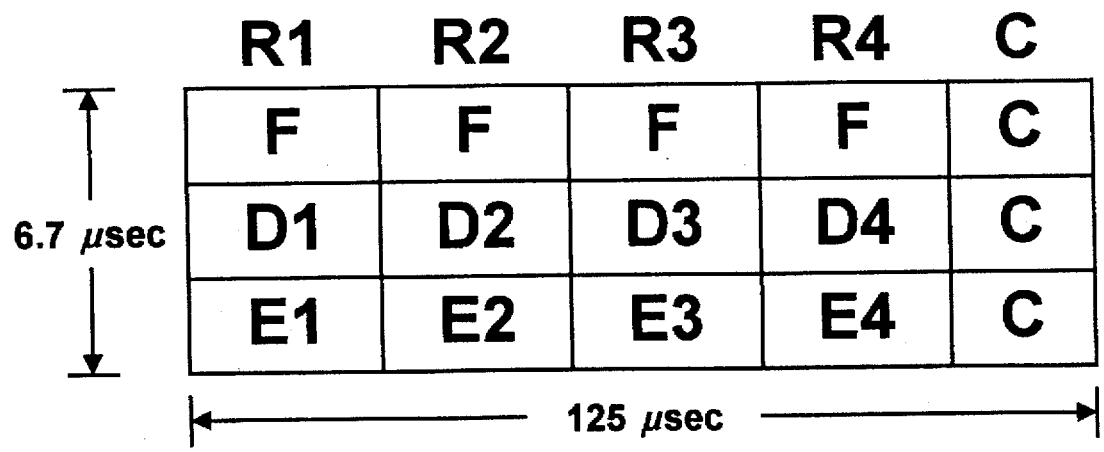
FIG. 8 is a timing diagram illustrating the general content of the interleaved radio and control channels of FIG. 7, during a single time slot.

The illustrative drawing of FIG. 8 shows additional details of the type of information transmitted between base station 80 and RSC 100 during different time segments of a single representative time slot. During each time slot, frame type and status (F) bits are transmitted, followed by Data (D) bits, followed by error correction code (E) bits, followed by Control (C) bits. The duration of each time slot is approximately 6.7 msec.

Figure 9:
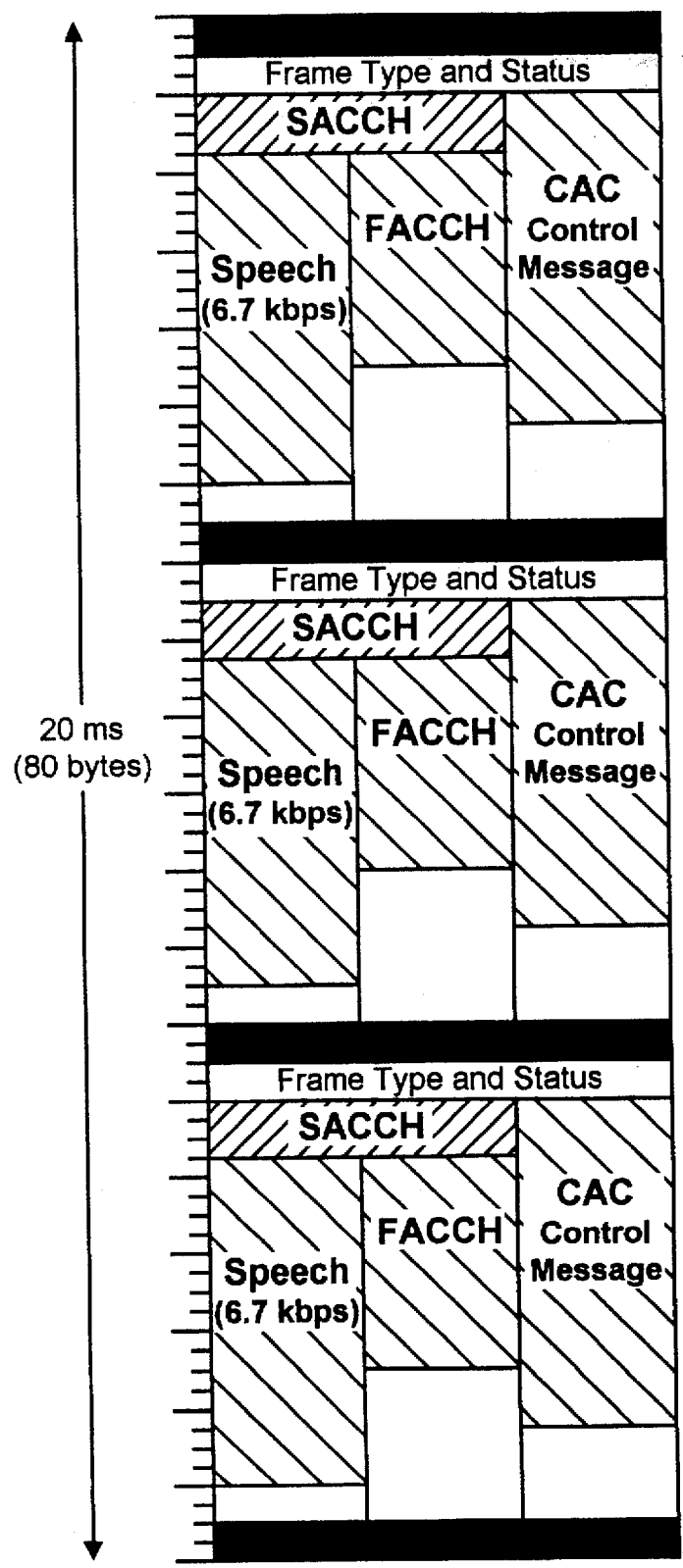
FIG. 9 is a timing diagram showing the organization and content of the bits transmitted for a single radio channel of FIGS. 7 and 8 during three successive time slots.

The illustrative drawings of FIG. 9 show the organization and content of the bits transmitted between base station 80 and RSC 100 for a single digital radio 86 (R1) for example, during three time slots. The bits in the different slots are all transmitted over the same subscriber unit radio channel 82 (containing R1), but they correspond to different subscriber units 60 sharing that same radio channel 82. For example, the first slot may contain information communicated between R1 and a first subscriber unit. The second slot may contain information communicated between R1 and a second subscriber unit. The third slot may contain information communicated between R1 and a third subscriber unit. In accordance with the PDC standard, SACCH is the Slow Associated Control Channel; FACCH is the Fast Associated Control Channel; CAC is the Common Access Channel. The bits are transmitted between the base station 80 and the RSC 100 in the course of a 20 msec interval which comprises three 6.7 msec time slots. There are, of course, similar transmissions (not shown) for each of the four radios in the course of the same 20 msec interval.

In alternate embodiments there could be many more radio channels and many more slots per channel. Generally, higher bit rate connections between cell base stations and the controller will support more radio channels and more slots per channel. Microwave or satellite links, for example, generally have adequate bandwidth to support more radio channels and more slots per channel. For example, in the alternative embodiment using a 384 kbps microwave link there are ten radios with three slots per channel for a total of thirty channels.

Figure 10:
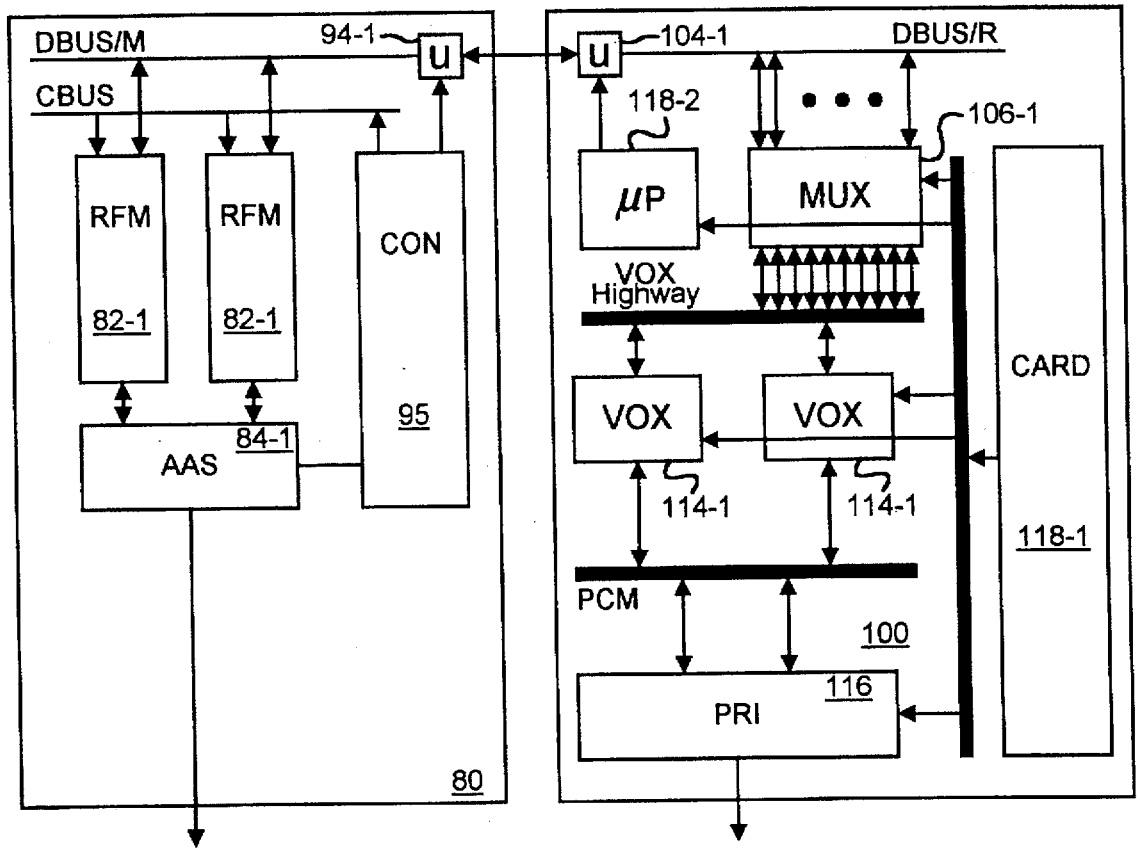
FIG. 10 is a block diagram showing details of the interfaces between various components of the embodiment of FIG. 4.

Referring to the illustrative drawing of FIG. 10, there is shown a block diagram which provides additional details of the interfaces between various components of the base station 80 and the RSC 100 of the presently preferred embodiment of the invention. The base station 80 includes a controller 95, a U-interface 94-1, four radio frequency modems (RFMs) 82-1 (only two shown) and an antenna assembly (AAS) 84-1 which contains the multiple antennas 84. The controller 95, RFMs 82-1 and U-interface 94-1 are interconnected by the DBUS/M and the CBUS as shown. The controller 95 controls the base station configuration and conducts diagnostics and to maintain statistics of base station and subscriber unit operations. The controller 95 communicates with the RFMs 82-1 via the CBUS. Each RFM 82-1 corresponds to a single subscriber unit radio channel 82. Each RFM includes a digital radio and includes a general purpose digital signal processing (DSP) circuit which is used to implement the wire FEC coder/decoder and the radio FEC coder/decoder. In a presently preferred embodiment, the DSP circuit is a TM8320C50 produced by Texas Instruments. The multiplexer/demultiplexer 92 of FIG. 4 is implemented as a tri-state bus, labelled DBUS/M, which carries information to and from the RSC 100 via the U-interface 94-1. In a presently preferred embodiment, as explained above, the U-interface 94-1 is the preferred implementation of a wire modem.

The RSC 100 is implemented using a Motorola VME-162 card 118-1 and a Motorola 68302 microprocessor 118-2, both of which are available from Motorola Corp. of Schaumburg, Illinois. The card 118-1 and the microprocessor 118-2 together implement the controller 118 of FIG. 4. The card 118-1 and the processor 118-2 also perform timing and control functions via a serial bus 121. The multiplexer/demultiplexer 106 of FIG. 4 is implemented as a tri-state bus DBUS/R, which switches information to and from the base station 80 via the U-interface 104-1. The multiplexer 106-1 is implemented as a programmable digital signal processor (DSP) that multiplexes and demultiplexes the signals to and from the base station 80 RFMs 82-1 and connects each radio slot to a VOX (voice) processor 114-1. The DSP that implements the multiplexer 106-1 also implements the wire FEC 110 illustrated in FIGS. 4 and 6A-6B. In the presently preferred embodiment, there is one VOX processor 114-1 per radio channel slot. The VOX processors 114-1, which correspond to the speech coder 114 of FIG. 4, are implemented using general purpose DSPs in the current embodiment. In a presently preferred embodiment, TMS320C50, Texas Instruments are used to implement the VOX processors. The output of each VOX processor 114-1 is a standard 64 kbps serial bit stream with either A-law or Mu-law coding, time multiplexed onto a high speed serial PCM line operating at 4.096 Mbps. This output then is provide to a PRI circuit 116 which uses a Primary Rate ISDN interface back to the PSTN 120. Specifically, the 4.096 Mbps signal is split into two 2.048 Mbps signals by the PRI circuit 116 which are sent over two E1 lines 105-1 to the PSTN 120.

Various modifications and improvements to the preferred embodiment can be made without departing from the spirit and scope of the invention. For example, one or more of the RSC channels may include dam coders or fax/modem coders in addition to or instead of voice coders. Hence, the wire FEC protected and radio FEC protected signals may be coded data signals or coded fax signals rather than coded voice signals. Thus, the foregoing description is not intended to limit the invention which is described in the appended claims in which:

What is claimed is:

1. A method of cellular communication among a subscriber unit, a base station and a switch controller comprising the steps of:

digitally encoding communications signals in the subscriber unit;

generating radio forward error correction (FEC) in the subscriber unit to protect the encoded communications signals during transmission;

transmitting the encoded communications signals together with the radio FEC by radio from the subscriber unit to the base station;

error correcting the transmitted encoded communications signals in the base station using the radio FEC;

generating wire FEC in the base station to protect the encoded communications signals during transmission;

transmitting the encoded communications signals together with the wire FEC from the base station to the controller;

error correcting the transmitted encoded communications signals in the controller using the wire FEC; and decoding the digitally encoded communications signals at the controller.

2. The method of claim 1 wherein the communications signals are speech signals.

3. The method of claim 1 wherein the communications signals are fax. signals.

4. The method of claim 1 wherein the communications signals are data signals.

5. The method of claim 1 wherein, said step of generating the radio FEC in the subscriber unit involves convolutional coding;

said step of error correcting in the base station using radio FEC involves Viterbi coding;

said step of generating forward wire FEC in the base station involves block coding; and said step of error correcting in the controller involves block coding.

6. A method of cellular communication among a subscriber unit, a base station and a switch controller comprising the steps of:

digitally encoding communications signals in the controller;

generating wire forward error correction (FEC) in the controller to protect the encoded communications signals during transmission;

transmitting the encoded communications signals together with the wire FEC from the controller to the base station;

error correcting the transmitted encoded communications signals in the base station using the wire FEC;

generating radio FEC in the base station to protect the encoded communications signals during transmission;

transmitting the encoded communications signals together with the radio FEC by radio from the base station to the subscriber unit;

error correcting the transmitted encoded communications signals in the subscriber unit using the radio FEC; and decoding the digitally encoded communications signals in the subscriber unit.

7. The method of claim 6 wherein the communication signals are speech signals.

8. The method of claim 6 wherein the communications signals are fax signals.

9. The method of claim 6 wherein the communications signals are data signals.

10. The method of claim 6 wherein, said step of generating the wire FEC in the controller involves block coding;

said step of error correcting in the base station using wire FEC involves block coding;

said step of generating radio FEC in the base station involves convolutional coding; and said step of error correcting in the subscriber unit involves Viterbi coding.

11. A cellular telephone communications base station comprising:

a digital radio;

a switch controller interface device;

first means for decoding radio Forward Error Correction (FEC) for first communication signals received by the digital radio;

second means for encoding such first communication signals with wire FEC prior to provision to the switch controller interface device;

third means for decoding wire FEC for second communication signals received by the switch controller interface device; and fourth means for encoding such second communication signals with radio FEC prior to provision to the digital radio.

12. The base station of claim 11 wherein the switch controller interface device includes a wire modem.

13. The base station of claim 11 wherein the switch controller interface device includes a microwave radio modem.

14. The base station of claim 11 wherein the switch controller interface device includes a radio modem that sends and receives communication signals via satellite.

15. The base station of claim 11 wherein the switch controller interface device includes a modem that sends and receives communication signals via fiber optic link.

16. The base station of claim 11 wherein the digital radio employs Time Division Multiple Access (TDMA) to send and receive communication signals.

17. The base station of claim 11 wherein, said first means employs Viterbi decoding to decode radio FEC;

said second means employs block encoding to encode wire FEC;

said third means employs block coding to decode wire FEC; and said fourth means employs convolutional encoding to encode radio FEC.

18. The base station of claim 11 wherein, a general purpose digital signal processor is programmed to provide said first, second, third and fourth means.

19. A cellular telephone communications base station comprising:

multiple digital radios;

a switch controller interface device;

multiple base station channels, each channel including,
first means for decoding radio Forward Error Correction (FEC) for first communication signals received by a digital radio,
second means for encoding wire FEC for such first communication signals, and
third means for decoding wire FEC for second communication signals received by the switch controller interface device,
fourth means for encoding radio FEC for such second communication signals; and multiplexing circuitry that directs communication signals between the multiple base station channels and the switch controller interface device.

20. The base station of claim 19 wherein said multiplexing circuitry includes a tri-state bus.

21. The base station of claim 19 and further including an antenna assembly connected to said multiple digital radios.

22. The base station of claim 19,
wherein each channel includes a respective digital signal processor programmed to operate as said first, second, third and fourth means;
wherein for each respective channel, one of said digital radios is connected to transfer communication signals to and from a respective digital signal processor of that respective channel.

23. The base station of claim 19,
wherein each channel includes a respective digital signal processor programmed to operate as said first, second, third and fourth means;
wherein for each respective channel, one of said digital radios is connected to transfer communication signals to and from the respective digital signal processor of that respective channel; and
wherein said multiplexing circuitry interconnects respective digital processors of respective channels with the switch controller interface.

24. A cellular telephone communications base station comprising:
multiple digital radios;
a switch controller interface device;
multiple respective base station channels coupled to transfer communication signals to and from respective digital radios, each respective channel including digital signal processing circuitry programmed to,
decode radio Forward Error Correction (FEC) for first communication signals received by the digital radio and to immediately encode wire FEC for such first communication signals to prepare the first communication signals for provision to the switch controller interface device, and
decode wire FEC for second communication signals received by the switch controller interface device and to immediately encode radio FEC for such second received communication signals to prepare the second communication signals for provision to a respective digital radio;
multiplexing circuitry that directs communication signals between the multiple base station channels and the switch controller interface device; and
an antenna assembly connected to the multiple digital radios.

25. A system for wireless local loop communications with the public switched telephone network (PSTN) comprising:
A. a subscriber unit which includes,
a digital subscriber unit radio,
a subscriber unit coder device which compresses and decompresses digital communication signals,
a radio forward Error Correction (FEC) device which encodes radio FEC for first compressed communication signals that have been compressed by the subscriber unit coder device prior to transmission by the digital subscriber unit radio and which decodes radio FEC for second compressed communication signals received by the digital subscriber unit radio prior to provision of the second compressed digital signals to the subscriber unit coder device for decompression, and
a telephone interface for transmitting decompressed communication signals to and from the coder device;
B. a base station which includes,
multiple digital base station radios,
a switch controller interface device,
multiple base station channels, each including,
first base station means for decoding radio FEC for first compressed communication signals received by a digital base station radio,
second base station means for encoding wire FEC for such first compressed communication signals prior to provision of the first compressed communication signals to the switch controller interface device,
third base station means for decoding wire FEC for second compressed communication signals received through the switch controller interface device,
fourth base station means for encoding radio FEC for such second compressed communication signals prior to provision of the second compressed communication signals to a digital base station radio,
base station multiplexing circuitry that directs compressed communication signals between the multiple base station channels and the switch controller interface device,
an antenna assembly connected to the multiple base station radios; and
C. a switch controller which includes,
a base station interface device,
a controller coder device which compresses and decompresses digital communication signals;
multiple controller channels, each including,
a wire FEC device which decodes wire FEC for first compressed communication signals received through the base station interface device prior to provision of the first compressed communication signals to the controller coder device for decompression, and which encodes wire FEC for second compressed communication signals that have been compressed by the controller coder device,
first controller multiplexing circuitry that directs compressed communication signals between the multiple controller channels and the base station interface device, and
second controller multiplexing circuitry that directs decompressed communication signals between the multiple controller channels and the PSTN.

26. The system of claim 25 wherein the subscriber unit digital radio and the base station digital radios employ TDMA to send and receive communication signals.

* * * * *